(12) United States Patent

Fujii et al.

(10) Patent No.: US 9,433,076 B2
(45) Date of Patent: Aug. 30, 2016

(54) MOUNTING STRUCTURE OF ELECTRONIC COMPONENTS PROVIDED WITH HEAT SINK

(71) Applicant: NEW JAPAN RADIO CO., LTD, Tokyo (JP)

(72) Inventors: Yoshio Fujii, Tokyo (JP); Shinji Hara, Saitama (JP)

(73) Assignee: NEW JAPAN RADIO CO., LTD (JP)

( * ) Notice: Subject to any disclaimer, the term of this patent is extended or adjusted under 35 U.S.C. 154(b) by 0 days.

(21) Appl. No.: 14/618,284

(22) Filed: Feb. 10, 2015

(65) Prior Publication Data
US 2015/0342025 A1  Nov. 26, 2015

(30) Foreign Application Priority Data
May 23, 2014   (JP) .................................. 2014-107397

(51) Int. Cl.
| | |
|---|---|
| *H05K 7/20* | (2006.01) |
| *H05K 1/02* | (2006.01) |
| *H01L 23/13* | (2006.01) |
| *H01L 23/36* | (2006.01) |
| *H01L 23/473* | (2006.01) |
| *H01L 23/495* | (2006.01) |
| *H05K 1/18* | (2006.01) |

(52) U.S. Cl.
CPC ............. *H05K 1/0203* (2013.01); *H01L 23/13* (2013.01); *H01L 23/36* (2013.01); *H05K 1/021* (2013.01); *H01L 23/4951* (2013.01); *H01L 2924/0002* (2013.01); *H05K 1/183* (2013.01); *H05K 2201/09072* (2013.01)

(58) Field of Classification Search
CPC .............................. G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | | | |
|---|---|---|---|---|
| 6,201,696 | B1 * | 3/2001 | Shimizu | .................. H01L 23/24 165/80.2 |
| 6,493,228 | B1 * | 12/2002 | Suzuki | .................. H01H 50/12 165/185 |

(Continued)

FOREIGN PATENT DOCUMENTS

| | | |
|---|---|---|
| JP | 2011171656 | 1/2011 |
| JP | 2013042030 | 2/2013 |

*Primary Examiner* — Anthony Haughton
*Assistant Examiner* — Razmeen Gafur
(74) *Attorney, Agent, or Firm* — Perman & Green, LLP

(57) ABSTRACT

There is provided a mounting structure of electronic components wherein the heat sink is disposed so as to allow a high heat releasing property to be achieved and ensure that manufacturing is easy. The resin film is provided at the lower surface side of the whole circuit element to which the lead is connected; a molding resin is molded at the upper side from the lower surface of the lead including the side portions of the lead, the circuit element and the connecting portions of the lead and the circuit element; the lead is connected to the electrode of the circuit board so that flattened back surfaces of a plurality of one side resin-molded elements are on the same horizontal plane; and a single heat sink is mounted on the back surfaces of the plurality of one side resin-molded elements.

3 Claims, 2 Drawing Sheets

(56) References Cited

U.S. PATENT DOCUMENTS

| | | | |
|---|---|---|---|
| 6,522,555 B2* | 2/2003 | Hirano | H01L 23/3737 174/51 |
| 7,202,559 B2* | 4/2007 | Zhao | H01L 23/13 257/707 |
| 8,937,384 B2* | 1/2015 | Bao | H01L 23/427 257/707 |
| 2002/0079562 A1* | 6/2002 | Zhao | H01L 23/3735 257/678 |
| 2002/0079572 A1* | 6/2002 | Khan | H01L 23/3677 257/707 |
| 2002/0154486 A1* | 10/2002 | Koike | H05K 5/0073 361/704 |
| 2003/0057550 A1* | 3/2003 | Zhao | H01L 23/24 257/734 |
| 2004/0183188 A1* | 9/2004 | Oohama | H01L 23/3107 257/706 |
| 2004/0212051 A1* | 10/2004 | Zhao | H01L 23/13 257/672 |
| 2004/0217472 A1* | 11/2004 | Aisenbrey | H01L 23/49855 257/734 |
| 2006/0065972 A1* | 3/2006 | Khan | H01L 23/13 257/712 |
| 2006/0232942 A1* | 10/2006 | Nakatsu | B60L 11/08 361/710 |
| 2007/0090502 A1* | 4/2007 | Zhao | H01L 23/3128 257/675 |
| 2007/0138651 A1* | 6/2007 | Hauenstein | H01L 23/13 257/782 |
| 2008/0304237 A1* | 12/2008 | Shiraishi | H05K 1/186 361/702 |
| 2009/0152714 A1* | 6/2009 | Yamagishi | H01L 23/13 257/724 |
| 2009/0194862 A1* | 8/2009 | Kitami | H01L 23/3185 257/690 |
| 2009/0237890 A1* | 9/2009 | Sekiya | H01L 23/3735 361/711 |
| 2010/0059873 A1* | 3/2010 | Chow | H01L 23/3128 257/686 |
| 2010/0096747 A1* | 4/2010 | Kusano | H01L 21/565 257/706 |
| 2010/0177483 A1* | 7/2010 | Yoshimoto | H05K 5/061 361/714 |
| 2011/0317366 A1* | 12/2011 | Fukutani | H01L 25/072 361/699 |
| 2012/0307501 A1* | 12/2012 | Tankala | F21K 9/90 362/294 |
| 2013/0043581 A1 | 2/2013 | Negoro | |
| 2013/0114212 A1* | 5/2013 | Tada | H01B 1/02 361/712 |
| 2013/0285233 A1* | 10/2013 | Bao | H01L 23/427 257/706 |

* cited by examiner

MOUNTING STRUCTURE OF ELECTRONIC COMPONENTS PROVIDED WITH HEAT SINK

TECHNICAL FIELD

The present invention relates to a mounting structure of electronic components, in which an electronic circuit such as a diode or a semiconductor integrated circuit is connected to an electric circuit board by soldering and a heat sink is mounted on the electronic components.

BACKGROUND OF THE INVENTION

In the case of mounting electronic components such as diodes on an electric circuit board, jointing an outer lead of an electronic component to an electric circuit board by soldering has been carried out so far as described in JP 2011-171656 A, and in recent years, mounting technology has been improved, and thus high density mounted boards have been increasing, and down-sizing and integration of mounted circuit board have been progressing.

Also, in the case of making an electric circuit by mounting a plurality of electronic components on an electric circuit board, a heat sink is attached to or arranged on the electronic components for prevention of overheating as described in JP 2013-42030 A.

By the way, in electric circuits to be used on in-vehicle units or industrial machinery, a high heat releasing property as well as down-sizing and integration is demanded.

Namely, in the case of mounting a plurality of electronic components on an electric circuit board, the pursuit of down-sizing and integration leads to a problem of overheating in a narrow area, and in mounting or arranging a heat sink or the like, it is necessary to take a measure for allowing heat releasing from electrical components to be performed efficiently, and it is demanded to totally consider a mounting layout in whole electric circuit including an arrangement of a heat sink.

Also, when providing a heat sink for a plurality of electronic components, it is demanded that manufacturing thereof should be easy.

SUMMARY OF THE INVENTION

The present invention was made in light of the above-mentioned problems, and an object of the present invention is to provide a mounting structure of electronic components provided with a heat sink that not only allows a high heat releasing property to be achieved by taking any measure for an arrangement of the heat sink but also ensures that manufacturing of the electronic components is easy.

In order to achieve the above-mentioned object, the mounting structure of electronic components provided with a heat sink according to the present invention comprises: a plurality of electronic components, each having lead portions and a resin-molded portion and being formed such that surfaces of one side of the respective lead portions and resin-molded portion are substantially on the same plane; an electric circuit board to which the respective lead portions of the plurality of electronic components are connected; a heat sink for releasing heat generated from the plurality of electronic components; and resin films disposed between the plurality of electronic components and the heat sink, wherein the lead portions are connected to the electric circuit board at the opposite surfaces to the one side of the lead portions in such a manner that the back surfaces of the plurality of electronic components, which are surfaces of the same side as the one side of the lead portions, are substantially on the same plane and one heat sink is provided on the back surfaces of the plurality of electronic components so as to cover the plurality of electronic components.

The electronic components are formed as a one side resin-molded element where a resin mold is formed from the back surface to the opposite surface thereof so as to cover a connected circuit element, and the resin-molded portions are disposed in openings or recesses formed on the electric circuit board.

According to the above-mentioned configuration, the plurality of electronic components mounted on the electric circuit board are arranged so that the back surfaces thereof are on the same horizontal plane, and the single heat sink is mounted on these back surfaces. In the case where the one side resin-molded elements are used as the electronic components, the heat sink can be attached to the molded elements efficiently. Namely, the heat sink can be mounted directly on the back surfaces of the one side resin-molded elements. Further, it is possible to form the openings or the recesses in the electric circuit board and dispose the molded portion in these openings or recesses.

According to the configuration of the present invention, the arrangement of the heat sink is so designed as to mount the single heat sink for the plurality of one side resin-molded elements, thereby allowing a high heat releasing property to be achieved and also making it possible to easily manufacture circuit components provided with the heat sink. Further, it is possible to make the structure thin (down-sizing).

DETAILED DESCRIPTION

Figure 1:
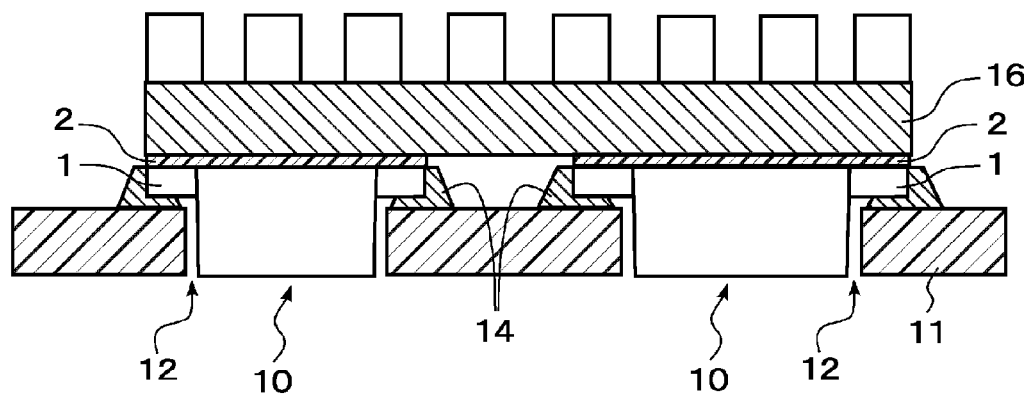
FIG. 1 is a partial cross-sectional view illustrating the mounting structure of electronic components, according to one embodiment of the present invention, provided with the heat sink.
Figure 2:
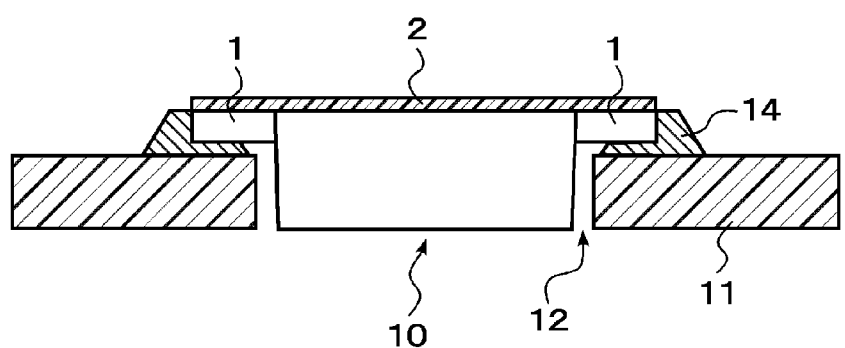
FIG. 2 is a partial cross-sectional view illustrating the configuration of the molded element in the electronic components of FIG. 1.
Figure 3:
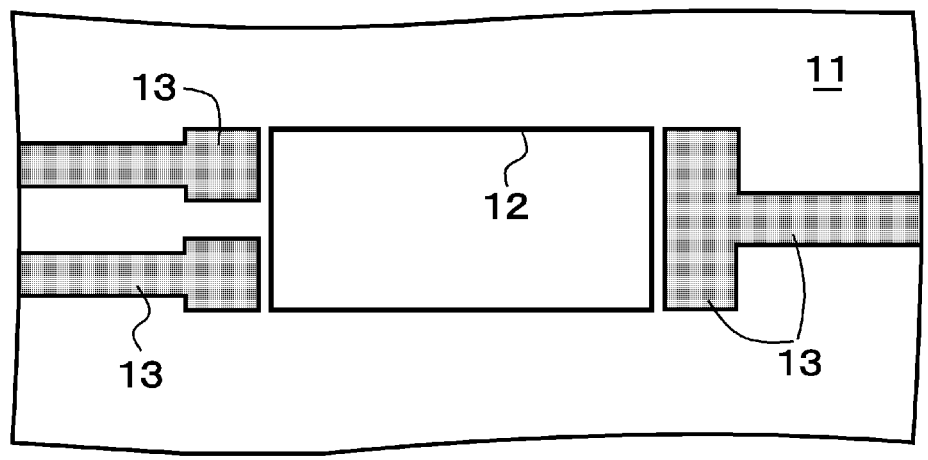
FIG. 3 is a top view illustrating the configuration of the electric circuit board used in the embodiment of the present invention
Figure 4:
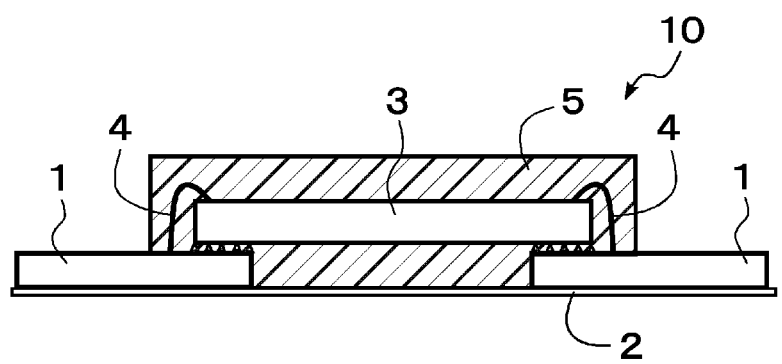
FIG. 4 is a partial cross-sectional view illustrating the one side resin-molded element used in the embodiment of the present invention.

FIG. 1 and FIG. 2 show the mounting structure of electronic components provided with a heat sink according to one embodiment of the present invention, and FIG. 3 shows the configuration of the electric circuit board. FIG. 4 shows the configuration of the one side resin-molded element according to the embodiment of the present invention, and first, this one side resin-molded element 10 is explained below. As shown in FIG. 4, a resin film (thin film) 2 is adhered to the lower surface of the lead (or lead frame) 1, and a circuit element (semiconductor element) 3 is connected to the upper side of the lead 1 with a die attach material. An upper terminal of the circuit element 3 is connected to the lead 1 using a metal wire 4 (by wire bonding). The thicknesses of the leads 1 are unified.

In the practical manufacturing, in an aggregate produced by connecting the plurality of circuit elements 3 to the lead frames, one side resin molding is carried out using an upper side mold, thereby forming a molded resin 5 at the side portions of the leads 1 (between the leads), around the circuit elements 3 and at the connecting portions between the circuit elements 3 and the wires 4, as shown in FIG. 4.

In the embodiment of the present invention, such one side resin-molded element 10 is connected to the electric circuit board of FIG. 3, thereby making the arrangement as shown in FIG. 2. Namely, as shown in FIG. 3, an opening (or a recess) 12 for disposing the one side resin-molded element 10 therein is provided and necessary wiring patterns (conductor patterns for electrodes and wirings) 13 are formed. Then, by placing the back surface of the one side resin-molded element 10, which includes the lower surface of the lead 1, upward, the resin-molded portion thereof is inserted and arranged in the opening 12, and the lead 1 of the one side resin-molded element 10 is connected to the electrode of the wiring pattern 13 by solder 14, thereby making an electronic component in the state as shown in FIG. 2. Namely, the opposite surface to the one side (the lower surface side) of the lead 1 is connected to the wiring pattern 13 of the electric circuit board 11.

As shown in FIG. 1, in the embodiment of the present invention, the plurality of one side resin-molded elements 10 is mounted for the plurality of openings 12 and wiring patterns 13 provided on the electric circuit board 11, and the back surfaces of these one side resin-molded elements 10 are arranged on the same horizontal plane. The heat sink 16 having heat releasing fins is adhered on the back surfaces of the plurality of one side resin-molded elements 10 through the resin films 2 for insulation using an adhesive or the like.

According to the above-mentioned embodiment, one heat sink 16 can be easily disposed for the plurality of one side resin-molded elements 10, and the electronic components provided with the heat sink can be produced easily. Namely, by unifying the thicknesses of the leads 1 and the resin films 2, it is possible to easily providing the heat sink 16 on a flat surface for the plurality of one side resin-molded elements 10. In manufacturing a semiconductor circuit, since thicknesses of leads (or lead frames) are unified, heights of the backside of a plurality of one side resin-molded elements 10 are nearly the same.

As mentioned above, in the embodiment of the present invention, it is possible to achieve a high heat releasing property satisfactorily by the heat sink 16 for the plurality of one side resin-molded elements 10. While the above-mentioned heat sink 16 is arranged over the plurality of one side resin-molded elements 10, it goes without saying that the number of heat sink 16 is not limited to one for all the one side resin-molded elements 10 mounted on the electric circuit boards and a plurality of heat sinks 16 may be arranged over the plurality of one side resin-molded elements.

Further, in the embodiment of the present invention, the heat sink 16 can be mounted on the circuit elements more efficiently by using the one side resin-molded elements. In general, when mounting the heat sink on the one side resin-molded elements 10 provided with the lead 1, in order to prevent conduction (electric contact) between the lead 1 and other components, it is necessary to provide an insulating adhesive or the like on the back surface (lower surface) of the one side resin-molded elements provided with the lead 1.

Meanwhile, as mentioned above, in the manufacture of a one side resin-molded element, in order to prevent a molding resin from leaking toward the bottom side of the lead frame, a resin film is disposed on the lower surface (back surface) of the whole circuit elements to which the leads (lead frame) have been connected, and this resin film is peeled off after the resin molding. Accordingly, in the embodiment of the present invention, this resin film is not peeled off and is used as it is, and by mounting the heat sink 16 directly on this resin film 2, this resin film 2 can be used for preventing conduction with the other components.

Further, in the embodiment of the present invention, the resin-molded portions of the one side resin-molded elements 10 are disposed in the openings (or recesses) 12, thereby enabling the electronic components to be made thin.

EXPLANATION OF SYMBOLS

1 Lead
2 Resin film
3 Circuit element
5 Molded resin
10 One side resin-molded element
12 Opening
14 Solder
16 Heat sink

What is claimed is:

1. A mounting structure of electronic components provided with a heat sink, comprising:
    a plurality of electronic components, each having lead portions and a resin-molded portion and being formed such that one side surface of the respective lead portions are substantially coplanar with one side surface of the resin-molded portion, so that the one side surface of the respective lead portions and the one side surface of the resin-molded portion form a back surface of the electronic component;
    an electric circuit board to which the respective lead portions of each of the plurality of electronic components are connected;
    a heat sink for releasing heat generated from the plurality of electronic components; and
    a resin film disposed between the plurality of electronic components and the heat sink,
    wherein each of the lead portions is connected to the electric circuit board at opposite surfaces to the one side surface thereof so that respective back surfaces of the plurality of electronic components are substantially coplanar with each other; and
    the heat sink is provided on the back surfaces of the plurality of electronic components such that a single heat sink covers at least two of the plurality of electronic components.

2. The mounting structure of electronic components provided with a heat sink of claim 1,
    wherein the electronic components are formed as a one side resin-molded element where the resin-molded portion is formed from the back surface of the electronic component toward the opposite surface thereof so as to embed a circuit element, and the resin-molded portions are disposed in openings or recesses formed on the electric circuit board.

3. The mounting structure of electronic components provided with a heat sink of claim 1,
    wherein the heat sink is provided on the back surfaces of the plurality of electronic components through only the resin film.

* * * * *